United States Patent [19]
Somasekhar et al.

[11] Patent Number: 6,014,041
[45] Date of Patent: Jan. 11, 2000

[54] DIFFERENTIAL CURRENT SWITCH LOGIC GATE

[75] Inventors: Dinesh Somasekhar, Bangalore, India; Kaushik Roy, West Lafayette, Ind.; Junji Sugisawa, Fort Collins, Colo.

[73] Assignee: Intel Corporation, Santa Clara, Calif.

[21] Appl. No.: 08/937,832

[22] Filed: Sep. 26, 1997

[51] Int. Cl.[7] .......................... H03K 19/094; H03K 19/20
[52] U.S. Cl. .......................... 326/115; 326/104; 326/112; 326/115; 326/119; 326/121
[58] Field of Search .................................. 326/104, 112, 326/115, 119, 121

[56] References Cited

U.S. PATENT DOCUMENTS

| | | | |
|---|---|---|---|
| 4,570,084 | 2/1986 | Griffin et al. | 307/452 |
| 4,710,650 | 12/1987 | Shoji | 307/452 |
| 5,216,295 | 6/1993 | Hoang | 307/451 |
| 5,550,491 | 8/1996 | Furuta | 326/115 |
| 5,841,298 | 11/1998 | Huang | 326/115 |

OTHER PUBLICATIONS

Dinesh Somasekhar, Kaushik Roy, *Differential Current Switch Logic: A Low Power DCVS Logic Family*; IEEE Journal of Solid–State Circuits, vol. 31, No. 7, 981–991 (Jul. 1996).

Chung–Yu Wu, Kuo–Hsing Cheng, *Latched CMOS Differential Logic (LCDL) for Complex High–Speed VLSI*, IEEE Journal of Solid–State Circuits, vol. 26, No. 9, 1324–1328 (Sep. 1991).

Shih–Lien Lu, *Implementation of Iterative Networks with CMOS Differential Logic*, IEEE Journal of Solid–State Circuits, vol. 23, No. 4, 1013–1017 (Aug. 1988).

Lawrence G. Heller, William R. Griffin; *Cascode Voltage Switch Logic: A Differential CMOS Logic Family*; ISSCC84, 16–17 (Feb. 22, 1984).

*Primary Examiner*—Michael Tokar
*Assistant Examiner*—James H. Cho
*Attorney, Agent, or Firm*—Blakely, Sokoloff, Taylor & Zafman LLP

[57] ABSTRACT

A differential current switch logic (DCSL) system is provided which has an evaluation tree including a plurality of input terminals and a pair of complementary output nodes. The DCSL system also has an output network which establishes a pair of state outputs at a predetermined level during a precharge phase and establishes the state outputs at complementary levels in response to the evaluation tree output nodes during an evaluate phase. First and second NMOS transistors are connected in series between the DCVS output state network and the evaluation tree output nodes with their gates coupled to the state outputs to isolate the outputs from the evaluation tree following evaluation.

17 Claims, 4 Drawing Sheets

DIFFERENTIAL CURRENT SWITCH LOGIC GATE

BACKGROUND OF THE INVENTION

1. Field of the Invention

The invention relates generally to logic system and more particularly, to a differential current switch logic (DCSL) system.

2. Description of Related Art

Logic systems implemented in complimentary metal oxide semiconductor (CMOS) devices are widely used in many types of computing systems. A useful semiconductor integrated logic circuit is known as "Domino," which is described in detail, for example, in a paper by R. H. Krambeck, et al. entitled "High-Speed Compact Circuits with CMOS," IEEE J. Solid-State Circuits, vol. SC-17, pp. 614–619 (1982). In general, a domino circuit comprises a collection of logic gates, at least some of which deliver logic signals as logic input signals to other gates. This entire circuit is periodically activated by a single clock edge during each period, so that each gate commutes its prescribed logic function during an evaluate phase that occurs once per clock period. Thus, when the circuit is clocked, each gate commutes its prescribed function, one after another, analogously to the falling of a series of dominos.

A differential cascode voltage switch (DCVS) logic system that is suitable for domino is described in U.S. Pat. No. 4,710,650 to Griffen et al. In general, a DCVS gate includes a negative-channel metal oxide semiconductor device (NMOS) evaluation tree and an output stage. The NMOS evaluation tree carries out the logic evaluation, while the output stage translates it to proper logic levels. The NMOS transistor tree generates both true and complementary values at its two output nodes. A design constraint for the NMOS transistor tree is that for each and every possible input combination, a path to ground exists from one of the output nodes. In other words, the NMOS evaluation tree functions as a switching network comprising a pair of complimentary switches, wherein one switch is closed (connected to ground), while the other switch is open.

The difference between various DCVS families is primarily in the output stage. While it is possible to have a static DCVS gate by employing static positive-channel metal oxide semiconductor device (PMOS) pull-ups at the output nodes, clocked DCVS gates are in general preferred because of their better performance. The simplest clocked DCVS gate is the clocked-CVSL gate 10 shown in FIG. 1. The output structure uses PMOS precharge transistors 2 and 4 to pull the inputs 3 and 5 of the inverters 7 and 9 high during the low phase of a clock CLK. The outputs Q and Q# of the inverters 7 and 9 are evaluated in the high phase of the clock. PMOS transistors 6 or 8 provide a weak feedback to reduce deterioration of a high level at one of the inverter inputs 3 or 5.

Higher performance clocked DCVS gates can be built by regeneratively driving the complementary outputs using an inverter loop. FIG. 2 shows a sample set differential logic (SSDL) gate 20, which senses the differential levels set up by an NMOS evaluation tree 12, and regeneratively amplifies them using a cross coupled inverter pair 14 consisting of PMOS transistors 16 and 17 and NMOS transistors 18 and 19. In the prior art SSDL circuit illustrated in FIG. 2, the SSDL gate 20 precharges on the low CLK phase, wherein NMOS transistors 21, 22 and 23 are off. The low CLK signal also allows precharge PMOS transistors 24 and 25 to conduct, charging outputs Q and Q# high. The gate evaluates on the high CLK pulse, with either Q or Q# discharging through NMOS transistor 21 or 23 (depending on the state of the NMOS evaluation tree 12). The cross coupled inverter pair 14 maintains Q and Q# at their differential levels until the next precharge phase.

SSDL is described in more detail by Groijohn and Hoeflinger in an article entitled "Sample-set differential logic (SSDL) for complex high speed VLSI," IEEE J. Solid-State Circuits, Vol. 21, no. 2, pp. 367–369, April 1986. High-performance high-complexity gates are possible with this topology, though SSDL gates generally suffer from high power consumption.

Enabled/disabled CMOS differential logic (ECDL), as proposed in a paper by S. L. Lu, entitled "Implementation of iterative networks with CMOS differential logic," IEEE J. Solid-State Circuits, Vol. 23, no. 4, pp. 1013–1017, August 1988, avoids the high power consumption of SSDL. A prior art ECDL circuit 30 is illustrated in FIG. 3. It employs a precharge low circuitry, and it avoids the static path present in the evaluate phase of SSDL. The ECDL circuit 30 precharges on the positive CLK pulse, with PMOS transistor 33 off, allowing the outputs Q and Q# to discharge through NMOS transistors 31 and 32. On the low CLK pulse, PMOS transistor 33 turns on, allowing $V_{cc}$ to charge either Q or Q#, depending on the state of the NMOS evaluation tree 12.

Each of the above prior art circuits precharges its outputs during one level of the clock and evaluates during the other. The internal nodes in the NMOS evaluation tree switch over a voltage which is equal to the supply voltage less the threshold voltage of the NMOS device. Hence, gate power dissipation increases with an increase in the complexity of the NMOS evaluation tree. In addition, the rising output is slow because of the need to charge up the internal nodes of the NMOS evaluation tree. For these reasons, circuit design techniques have largely overlooked DCVS circuits in favor of traditional CMOS styles, primarily because the high activity of DCVS gates causes them to compare unfavorably with respect to conventional CMOS implementations from a power perspective. Further, the need to route differential signals (resulting in high signal activity), and the high clock load of clocked DCVS gates are known disadvantages compared to conventional CMOS logic gates. However, DCVS gates have potential advantages as compared to standard CMOS NAND(NOR) implementations.

High complexity, high fan-in gates are possible. Complex gates can be implemented with lower transistor count. Certain clocked DCVS families have very low propagation delay for large, complex gates. Clocked DCVS styles often integrate both the sequential and combinatorial portions into a single complex gate. This style of logic is hence suitable for high-speed VLSI.

Both true and complementary outputs are available. This makes completion of gate evaluation easy to detect. It is this reason that makes DCVS gates the logic family of choice for implementing self-timed circuits.

In common with dynamic logic, gate input loading is very light and consists of few NMOS transistors.

The high power consumption of DCVS gates is a definite hindrance toward their greater acceptance. The power consumed by a DCVS gate can be subdivided into the power consumed because of outputs switching and the power consumed because of switching at the gate internal nodes. As the gate complexity increases, the number of internal nodes switched in the NMOS evaluation tree increases. Hence, power dissipation due to switching in internal nodes is a non-negligible factor of the total gate power.

Differential current switch logic (DCSL), a class of clocked DCVS logic circuits, has been developed in an attempt to limit internal voltage swings and improve power performance of previous DCVS. DCSL is described in "Differential Current Switch Logic: A Low Power DCVS Logic Family," IEEE J. Solid State Circuits, Vol. 31, no. 7, July 1996, by D. Somasekhar and K. Roy. FIG. 4 illustrates a simplified block diagram of a DCSL switch 40. The DCSL switch 40 includes an NMOS evaluation tree 12 and a DCVS-family output state network 41, such as those illustrated in FIGS. 1–3. In addition, two NMOS transistors 42 and 43 are coupled in series between the DCVS-family output state network 41 and the NMOS evaluation tree 12, with the gates of the transistors 42 and 43 cross-coupled to the state outputs Q and Q#.

As with the DCVS circuits illustrated in FIGS. 1–3, the outputs Q and Q# precharge to a given level. During the evaluate phase, one output sees a path to ground through the NMOS evaluation tree 12 and evaluates low, with the complementary output evaluating high. The transistors 42 and 43 function to isolate the outputs Q and Q# from the NMOS evaluation tree 12 following evaluation. Assume Q evaluates low and Q# evaluates high. The low value from Q is cross-coupled to the gate of one transistor 43, keeping it off, thereby isolating the high output Q# from the NMOS evaluation tree 12 and protecting the high value from falling low, even if a path to ground through the NMOS evaluation tree 12 is established following evaluation. Further, this ensures that no static path exists from the voltage supply $V_{cc}$ to ground, reducing node voltage swings in the NMOS evaluation tree 12.

A schematic diagram of an embodiment of a prior art DCSL circuit 40 is shown in FIG. 5. The DCSL gate 40 of FIG. 5 is a "precharge high" gate, in that the gate outputs Q and Q# both charge high during the precharge phase. It consists of a voltage supply $V_{cc}$, an NMOS evaluation tree 12, a cross coupled inverter pair 44 (PMOS transistors 46 and 48, and NMOS transistors 50 and 52), and precharge transistors 54 and 56. A clock signal CLK is coupled to the gates of the precharge transistors 54 and 56, and also to the gates of NMOS transistors 58, 60 and 62. NMOS isolation transistors 42 and 43 are cross coupled to outputs Q and Q#. In other words, the NMOS isolation transistor 42 has its drain terminal coupled to output Q and its source terminal connected to a first output 68 of the NMOS evaluation tree 12 through the clocked transistor 58, with the gate of the NMOS transistor 42 coupled to output Q#. Similarly, the NMOS transistor 43 has its drain terminal coupled to output Q# and its source terminal connected to a second output 70 of the NMOS evaluation tree 12 through the clocked transistor 62, with the gate of the NMOS transistor 43 coupled to Q.

The NMOS evaluation tree 12 further includes a plurality of inputs. The NMOS evaluation tree functions such that for every possible input combinations, there is a single path to ground from one of the output nodes 68 and 70. In other words, the NMOS evaluation tree functions as a switching network comprising a pair of complimentary switches, S1 and S2, wherein when one switch (S1 in FIG. 5) is closed (connected to ground), the complimentary switch S2 is open.

Operation of the DCSL gate 40 starts with the CLK signal low, turning off the NMOS transistors 58, 60 and 62, while turning on the precharge PMOS transistors 54 and 56. $V_{cc}$ charges the outputs Q and Q# high through the precharge PMOS transistors 54 and 56. The evaluate phase begins with stable inputs to the NMOS evaluation tree 12 and the CLK signal going high. For purposes of illustration, assume that the inputs to the NMOS evaluation tree 12 cause a path to exist from output 68 to ground (S1 closed and S2 open). The CLK signal going high switches the NMOS transistors 58, 60 and 62 on, while Q and Q# being high (from the precharge phase) ensure that the NMOS isolation transistors 42 and 43 are switched on.

The outputs Q and Q# discharge toward ground through NMOS transistors 58, 60, and 62. The discharge of Q and Q# is not symmetrical because the NMOS evaluation tree assures that only one of the outputs, Q, has a stronger path to ground. This causes Q to fall faster than Q#. The cross-coupled inverter 44 functions as a sense-amplifier and boosts the output voltage differential. Once the inverter switch threshold is crossed by Q, Q# swings high. The low going transition of Q disconnects the NMOS evaluation tree 12 from Q# by progressively cutting off the transistor 43. Hence, the rising node Q# is isolated from the NMOS evaluation tree 12. This action limits the charge up of internal nodes in the NMOS evaluation tree 12. This is unlike other DCVS circuits where the NMOS pull-down tree is never disconnected from the outputs Q and Q#. DCVS circuits charge the internal nodes of the NMOS evaluation tree 12 up to $V_{cc}$-$V_{tn}$, where $V_{cc}$ is the supply voltage (5V) and Vtn is the threshold voltage of the NMOS device (of the order of 1V). In contrast, DCSL charges internal nodes to much smaller voltages. Simulations show that internal node voltage swings for DCSL are of the order of 1V. The gate comes to rest in a state with Q low and Q# high.

On completion of evaluation, the fact that the high output (Q# in the FIG. 5) is disconnected from the NMOS evaluation tree assures that flirter changes in inputs do not propagate to the output Q#. This is unlike CMOS logic styles, in which changes in the inputs of clocked logic cause dc through-currents, or the gate's state output is destroyed. Strict adherence to the design constraint of building DCVS NMOS evaluation trees is no longer required. Gate inputs may cause paths to ground in both halves of the NMOS evaluation tree 12. However, assuring that one of the paths has a stronger pull-down than the other allows the DCSL gate to evaluate its inputs. On completion of evaluation, no static current paths from $V_{cc}$ to ground exist.

While a prior art DCSL gate 40, such as the circuit of FIG. 5, reduces the power requirement as compared to standard DCVS gates, shortcomings exist. In a known DCSL gate 40, such as in FIG. 5, the outputs Q and Q# are directly fed back to the inverter loop 44 during both the precharge phase and the evaluate phase. This strong positive feedback can upset the operation of the gate 40 if the two halves are not balanced. The circuit will not only amplify differential currents arising from the NMOS evaluation tree 12, but also any other current differentials such as unbalanced output loads. Therefore, prior art DCSL circuits are not robust and they are sensitive to load imbalances at the outputs Q and Q#.

Moreover, in the circuit of FIG. 5, the outputs Q and Q# are both charged high. At the beginning of the evaluate phase, both outputs have a path to ground through the transistor 60; thus, both outputs begin to fall low. The additional path to ground through the NMOS evaluation tree 12 for one output causes that output to fall faster, and the cross coupled inverter 44 boosts the output voltage differential in the correct direction. While this causes the outputs Q and Q# to eventually evaluate to their proper complementary levels, the initial discharge of the output that ultimately swings high causes a voltage spike at the output.

The output voltage spike of known DCSL circuits causes several problems. First, it causes interference problems with other circuits. For example, it would be difficult to drive a static CMOS gate with a prior art DCSL circuit, as illustrated in FIG. 5. Next, the discharge/recharge action of the high output increases power consumption, which is a primary concern. Additionally, the voltage spike degrades operation at low voltage levels. Prior art DCSL gate performance degrades with increasing threshold voltage as a fraction of supply voltage ($V_{tn}/V_{cc}$).

These factors make implementation of known DCSL gates difficult in practical designs. Thus, a need exists for a robust DCSL gate capable of operation at lower voltages that is suitable for implementing high speed clocked CMOS circuits.

SUMMARY OF THE INVENTION

In one aspect of the present invention, a differential current switch logic system includes an evaluation tree which has a plurality of input terminals and first and second output nodes, and an output network which has first and second state outputs. The output network establishes both state outputs at a predetermined level during a precharge phase. During an evaluate phase, the output network provides a path to ground for one of the state outputs in response to the evaluation tree output nodes to establish the state outputs at complementary levels. First and second transistors are connected in series between the first and second state outputs and the first and second evaluation tree output nodes, respectively. The gate of the first transistor is connected to the second state output, and the gate of the second transistor is coupled to the first state output. In a further aspect of the invention, a state output amplifier amplifies the complementary outputs.

In another aspect of the present invention, a method of providing complementary state outputs responsive to an evaluation tree which provides one path to ground in response to a plurality of inputs thereto, the state outputs being selectively isolated from the evaluation tree by a pair of switchable isolation devices coupled therebetween includes the steps of providing an output network including a pair of state outputs and precharging both state outputs to a predetermined precharge level during a precharge phase. The method also includes maintaining the precharge level by feeding back the precharge level state outputs to the isolation devices, establishing complementary evaluation levels at the state outputs by providing a path to ground through the evaluation tree for one of the state outputs while isolating the other state output from ground and charging it high during an evaluate phase, and cutting off the high state output from the evaluation tree by feeding back the evaluation level state outputs to the isolation devices.

BRIEF DESCRIPTION OF THE DRAWINGS

Other objects and advantages of the invention will become apparent upon reading the following detailed description and upon reference to the drawings in which.

Figure 1:
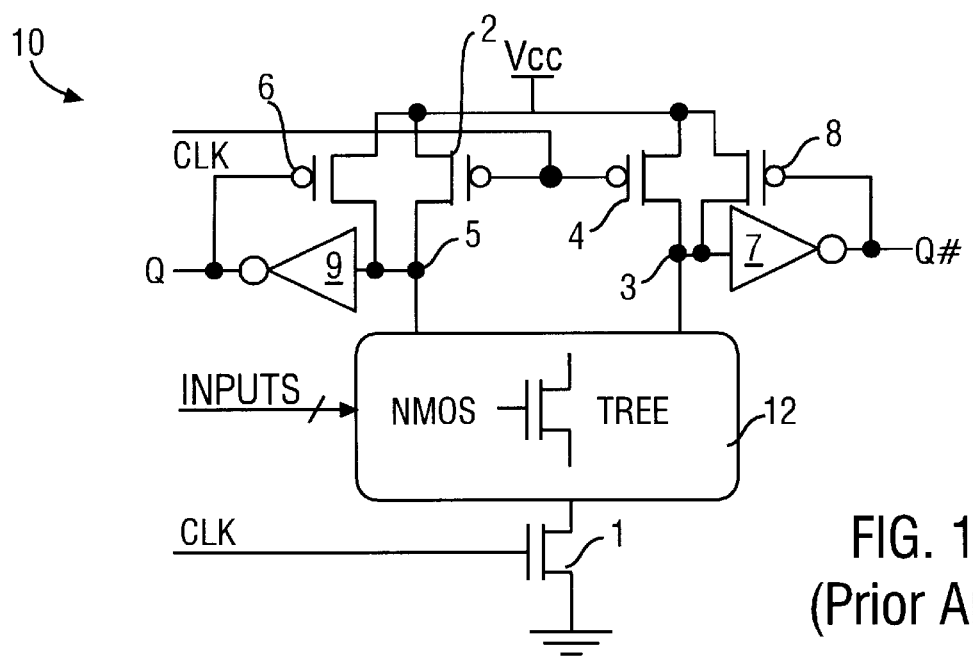
FIG. 1 illustrates a schematic of a prior art clocked differential cascode voltage switch (DCSL) system.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 6:
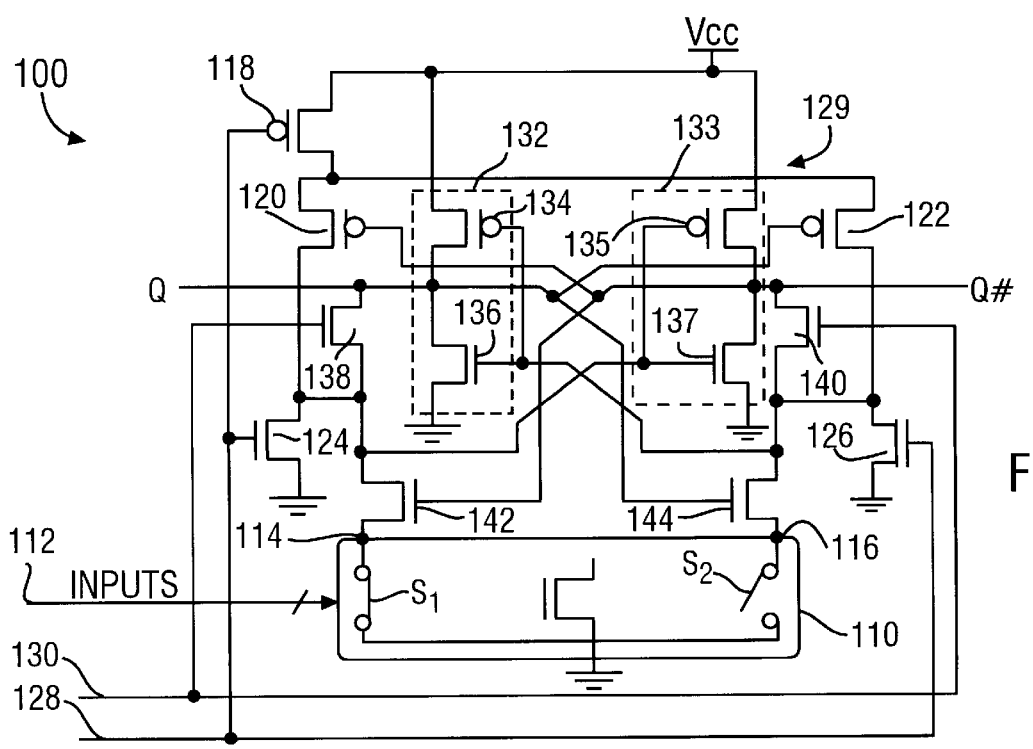
FIG. 6 is a schematic diagram of an exemplary DCSL circuit in accordance with the present invention.

Turning to the drawings and in particular, to FIG. 6, an embodiment of a robust differential current switch logic (DCSL) gate 100 is illustrated. The exemplary DCSL gate 100 includes an evaluation tree 110, including a plurality of input terminals 112 and an output network including a pair of state output nodes 114 and 116. In an embodiment of the invention, the evaluation tree 110 is an NMOS evaluation tree.

The NMOS evaluation tree 110 functions such that for all possible input combinations, a single path to ground exists from one of the output nodes 114 or 116. In other words, the NMOS evaluation tree 110 functions as a switching network comprising a pair of complimentary switches, S1 and S2, wherein when one switch (S1 in FIG. 6) is closed (connected to ground), the complimentary switch is open (S2 in FIG. 6).

The output network functions to establish both of the state outputs Q and Q# at a predetermined level (high or low) during a precharge phase, and to establish the state outputs Q and Q# at complementary levels during an evaluate phase in response to the evaluation tree 110.

A voltage supply $V_{cc}$ is coupled to the drain terminal of a clocked PMOS transistor 118, which has its source terminal coupled to the drain terminals of PMOS transistors 120 and 122. The source terminals of the transistors 120 and 122 are connected to ground through the clocked NMOS precharge transistors 124 and 126. A precharge clock 128 is coupled to the gates of the NMOS transistors 124 and 126 and the PMOS transistor 118.

A cross coupled inverter loop 129 functions as a state output amplifier and is formed generally by first and second sense transistor pairs 132 and 133. The sense transistor pair 132 includes a PMOS transistor 134 and an NMOS transistor 136, and the sense transistor pair 133 includes a PMOS transistor 135 and an NMOS transistor 137. The PMOS transistor 134 and the NMOS transistor 136 are coupled in series between $V_{cc}$ and ground with their gate terminals coupled together. The PMOS transistor 135 and the NMOS transistor 137 are likewise arranged. A first state output Q is formed at the junction defined by the intersection of the PMOS transistor 134 and the NMOS transistor 136, and a second state output Q# is formed at the junction defined by the intersection of the PMOS transistor 135 and the NMOS transistor 137.

Figure 2:
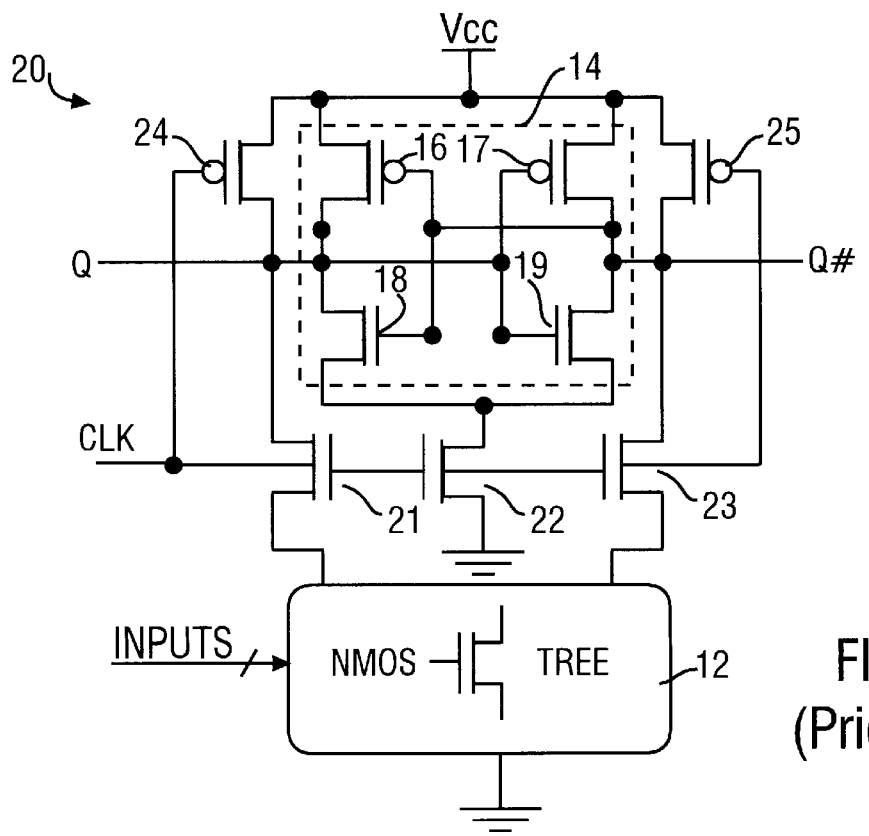
FIG. 2 illustrates a schematic of a prior art sample set differential logic (SSDL) switch.
Figure 3:
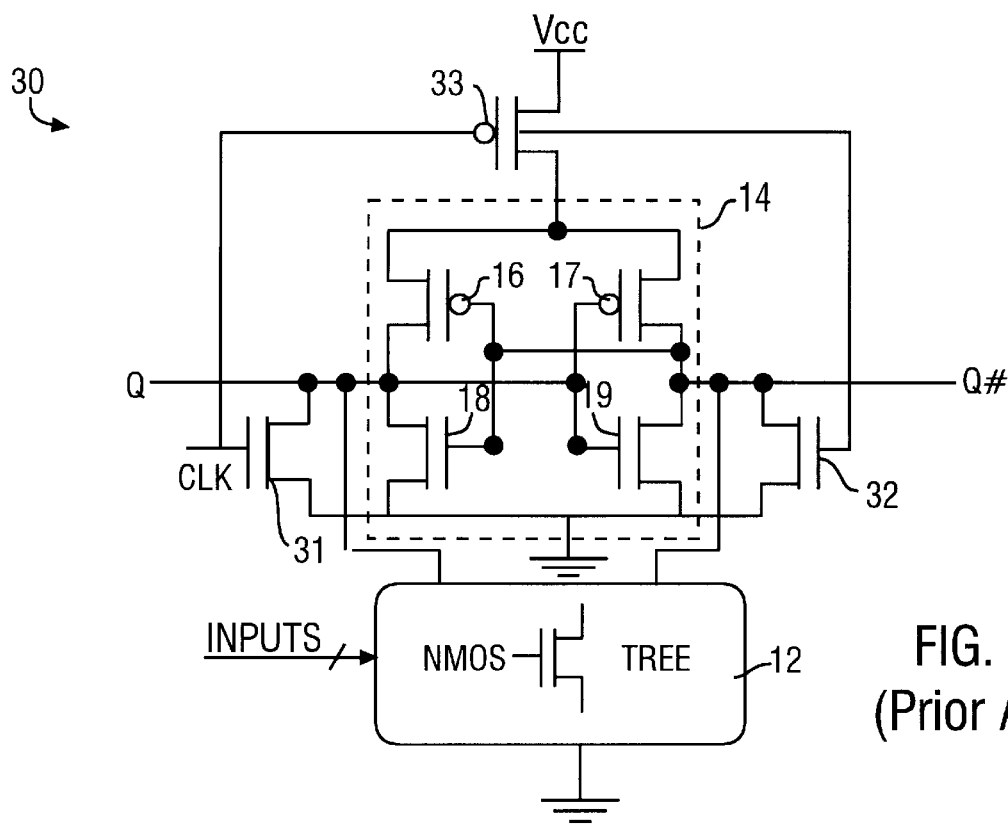
FIG. 3 illustrates a schematic of a prior art enabled/disabled CMOS differential logic (ECDL) switch.
Figure 4:
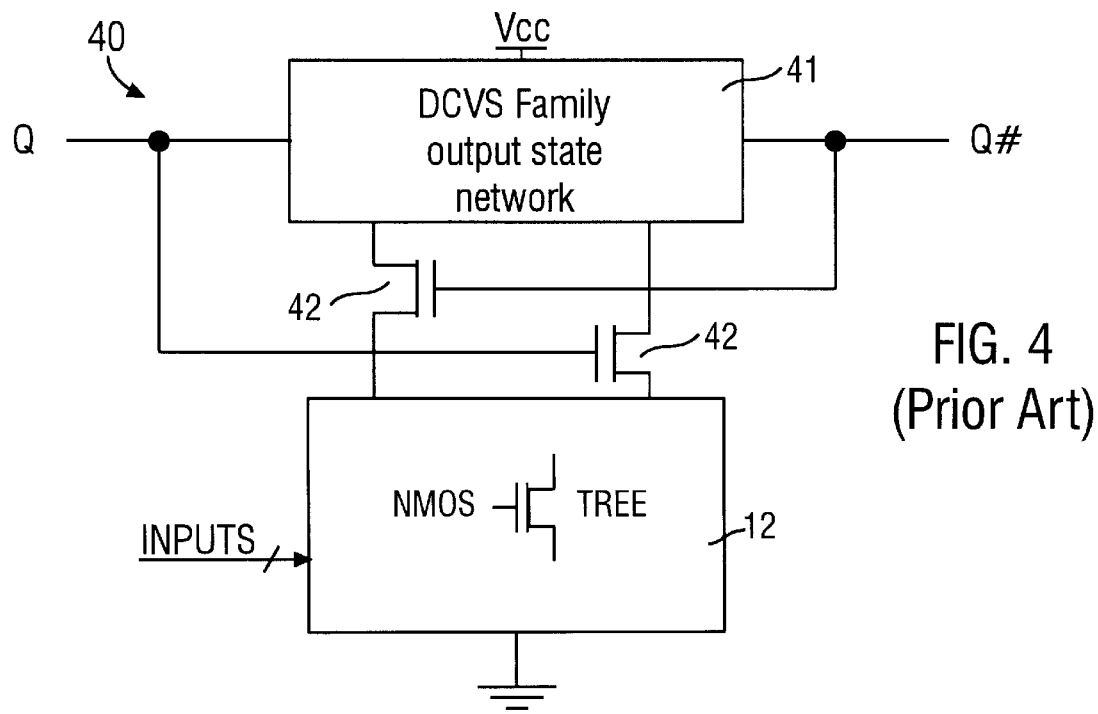
FIG. 4 illustrates a simplified schematic of a prior art differential current switch logic (DCSL) circuit.
Figure 5:
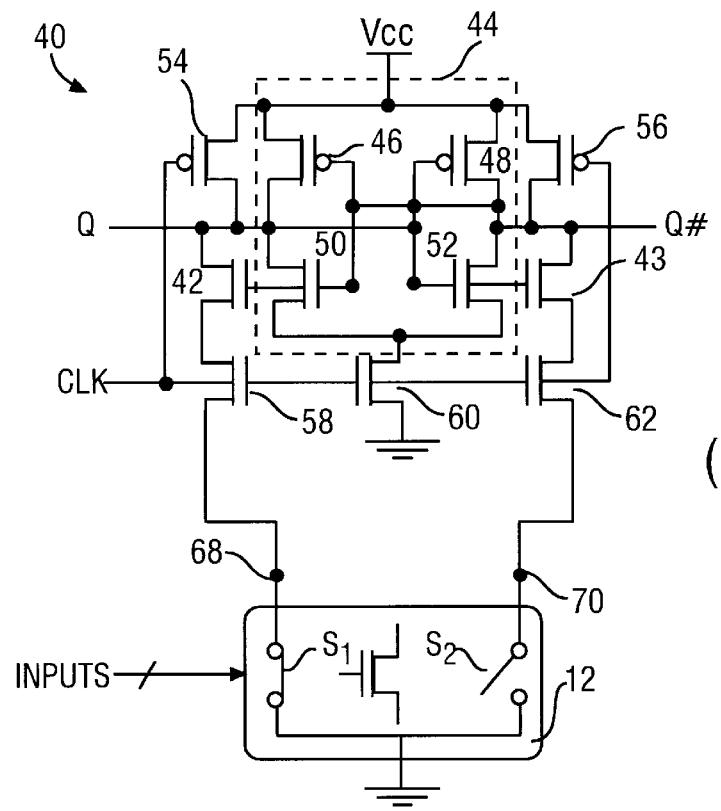
FIG. 5 illustrates a schematic of a prior art DCSL embodiment.

In the prior art DCVS circuits illustrated in FIGS. 2 and 3 and the prior art DCSL circuit illustrated in FIG. 5, the state outputs Q and Q# are cross coupled directly to the gates of the opposite PMOS/NMOS transistor pair. In the instant DCSL gate 100, the state outputs Q and Q# are cross coupled to the gates of the sense transistor pairs 133 and 132, respectively, through clocked NMOS evaluation transistors 138 and 140. An evaluation clock 130 is coupled to the gates of the evaluation transistors 138 and 140.

Isolation transistors 142 and 144 are coupled in series between the evaluation transistors 138 and 140 and the NMOS evaluation tree complementary output nodes 114 and 116, respectively. The gate of the isolation transistor 142 is coupled to the state output Q#, and the gate of the isolation transistor 144 is coupled to the state output Q.

In general, operation of the DCSL gate 100 includes a precharge phase and an evaluate phase. During precharge, the evaluation clock 130 is low and the precharge clock 128 is high, and both of the state outputs Q and Q# precharge to a high output level. Stable inputs are provided to the NMOS evaluation tree 110, establishing a single path to ground from either of the output nodes 114 or 116. In effect, the switch S1 is closed (path to ground from output node 114) and the switch S2 is open, or the switch S2 is closed (path to ground from output node 116) and the switch S1 is open. During the evaluate phase, the precharge clock 128 goes low and the evaluate clock 130 goes high, and the DCSL gate 100 establishes one state output high and the other state output low.

The operation of the novel DCSL gate as embodied in the circuit illustrated in FIG. 6, can be better described through an example:

PRECHARGE:

During the precharge phase, the precharge clock 128 goes high and the evaluate clock 130 goes low. The high precharge clock 128 turns off the PMOS transistor 118 and turns on the precharge transistors 124 and 126, in turn pulling down the gates of sense transistor pairs 132 and 133. This has the effect of turning on the PMOS transistors 134 and 135 and turning off the NMOS transistors 136 and 137, resulting in $V_{cc}$ charging both of the state outputs Q and Q# high. At this point, the state outputs Q and Q# are not cross coupled to the gates of their respective sense transistor pairs 133 and 132 because the low evaluate clock 130 turned the evaluate transistors 138 and 140 off, thereby isolating the state outputs Q and Q# from the inverter loop 129. This reduces the noise sensitivity of the gate 100 and improves robustness.

In the precharge phase, the inputs 112 to the NMOS evaluation tree 110 are high, which ensures that every internal node in the NMOS evaluation tree 110 is discharged. The high state outputs Q and Q# are also cross coupled to the gates of the isolation transistors 144 and 142, respectively, turning them both on. If the precharge clock 128 were to inadvertently go low, turning off the precharge transistors 124 and 126, the gates of the sense transistor pairs 132 and 133 would remain low through the isolation transistors 144 and 142, respectively. This ensures that the state outputs Q and Q# remain precharged high even if the evaluation clock 128 goes low, allowing the timing specification of the precharge clock 128 to be loosened.

EVALUATE:

Assume that the inputs 112 to the NMOS evaluation tree 110 are such that a path to ground from the output node 114 is established (switch S1 is closed and switch S2 is open). In the evaluate phase, the precharge clock 128 goes low and the evaluate clock 130 goes high. The high evaluate clock turns on the evaluate transistors 124 and 126. Since the isolation transistors 142 and 144 are on from the precharge phase, a path from the state outputs Q and Q# to the NMOS evaluation tree 110 exists through transistors 138–142 and 140–144, respectively.

Since switch S1 is closed, the state output Q is coupled to ground and discharges. At the start of the evaluate phase, the only path to ground is through the transistor 138, the transistor 142, and switch S1. Thus, only state output Q begins to discharge. Switch S2 is open, so no discharge path for state output Q# exists, and it remains high. The gate of the isolation transistor 144 is coupled to the falling state output Q, so the isolation transistor 144 charges up as the state output Q discharges. This, in turn, turns the transistor 136 on and accelerates the falling output transition of the state output Q.

The falling state output Q is cross coupled to the isolation transistor 144, turning it off and isolating the high state output Q# from the NMOS evaluation tree 110. This limits internal voltage swings in the NMOS evaluation tree 110. Further, once the gate 100 completes the evaluate phase, input changes will not affect the output voltage, allowing precharge of the inputs 112, if desired. Since $V_{cc}$ is also cut off from the NMOS evaluation tree 110, it cannot have the effect of pulling a low state output high. Even if a path to ground from the output node 116 is established, the high state output Q# is protected because it is isolated from the NMOS evaluation tree 110 by the isolation transistor 144.

When the evaluation clock 130 goes high and turns on the evaluation transistors 138 and 140, the inverter loop 129 comprising the sense transistor pairs 132 and 133 is closed. This allows the state outputs Q and Q# to be fed back to the sense transistor pairs 133 and 132. Sense transistor pairs 132 and 133 each sense the voltage at their respective state output and amplify the state outputs Q and Q# in the proper direction. The high at state output Q# keeps the PMOS transistor 134 off and the NMOS transistor 136 on, isolating the state output Q from $V_{cc}$ and providing another discharge path to ground. Alternately, the low from the state output Q coupled back to the sense transistor pair 133 keeps the PMOS transistor 135 on and the NMOS transistor 137 off, allowing $V_{cc}$ to maintain the state output Q# high.

The PMOS transistors 118, 120 and 122 function to ensure that the drains of the isolation transistors 142 and 144 have rail to rail voltage swings. The low precharge clock 128 turns on the PMOS transistor 118. In the exemplary circuit of FIG. 6, the state outputs Q and Q# are cross coupled to the gates of the PMOS transistors 120 and 122. Thus, the low at state output Q turns on PMOS transistor 122, providing a path from $V_{cc}$ to the drain of isolation transistor 144 through the clocked PMOS transistor 118 and the PMOS transistor 122. The PMOS transistors 118, 120 and 122 are secondary devices in the embodiment of the invention illustrated in FIG. 6, operating to enhance performance of the exemplary DCSL gate. They are not considered critical to the invention, and embodiments of the invention excluding these devices are envisioned.

The DCSL circuit 100 as described above in conjunction with FIG. 6 reduces the output voltage spike of prior DCSL gates, in turn reducing the problems associated therewith. Low voltage operation is improved and power consumption is decreased. Further, the novel DCSL circuit 100 of the invention is robust and less sensitive to noise and circuit imbalances.

A circuit such as that illustrated in FIG. 6 and described in conjunction therewith is suitable for implementing high speed clocked CMOS circuits. When used in combination with domino, it allows a reduction in the number of logic levels. This style of logic is best suited when it is possible to merge a number of small gates into a large complex DCVS gate. In general, it has been found that at least six inputs 112 are required before a significant advantage over domino is realized. The maximum number of inputs for reliable operation is about 18.

Figure 7:
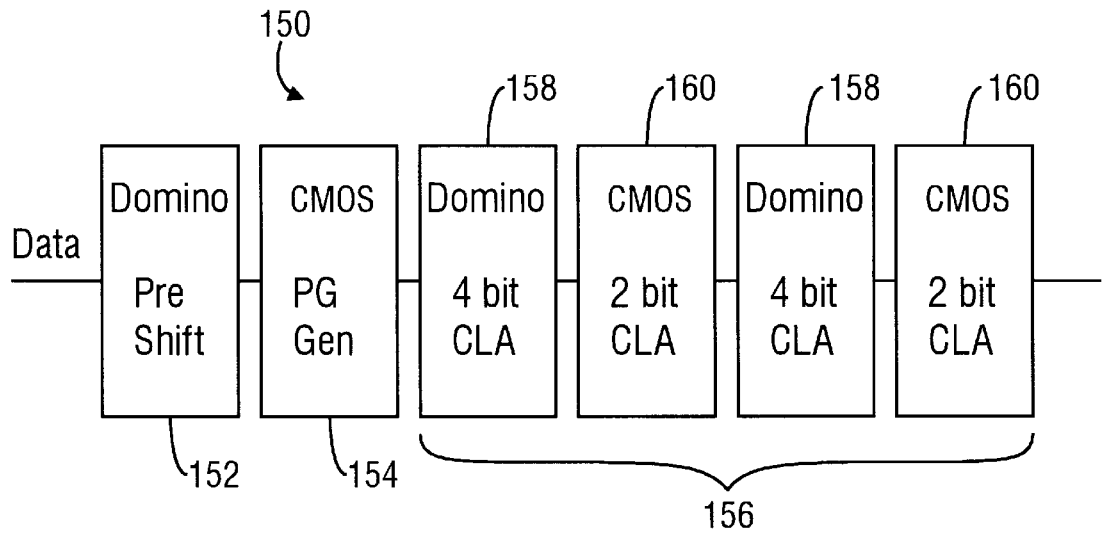
FIG. 7 illustrates a block diagram of a prior art 64 bit adder implemented in Domino.

An exemplary implementation of a DCSL circuit in accordance with the present invention is as follows: FIG. 7 illustrates a block diagram of a prior art 64 bit adder 150 implemented in Domino. The prior art adder 150 has a total of six logic levels, including a Domino pre-shifter 152, a CMOS propagate generate (PG) circuit 154, and a four-stage carry computation tree 156. The carry computation tree 156 comprises two sets of a 4 bit Domino carry-look-ahead (CLA) 158 and a 2 bit CMOS CLA 160.

Figure 8:
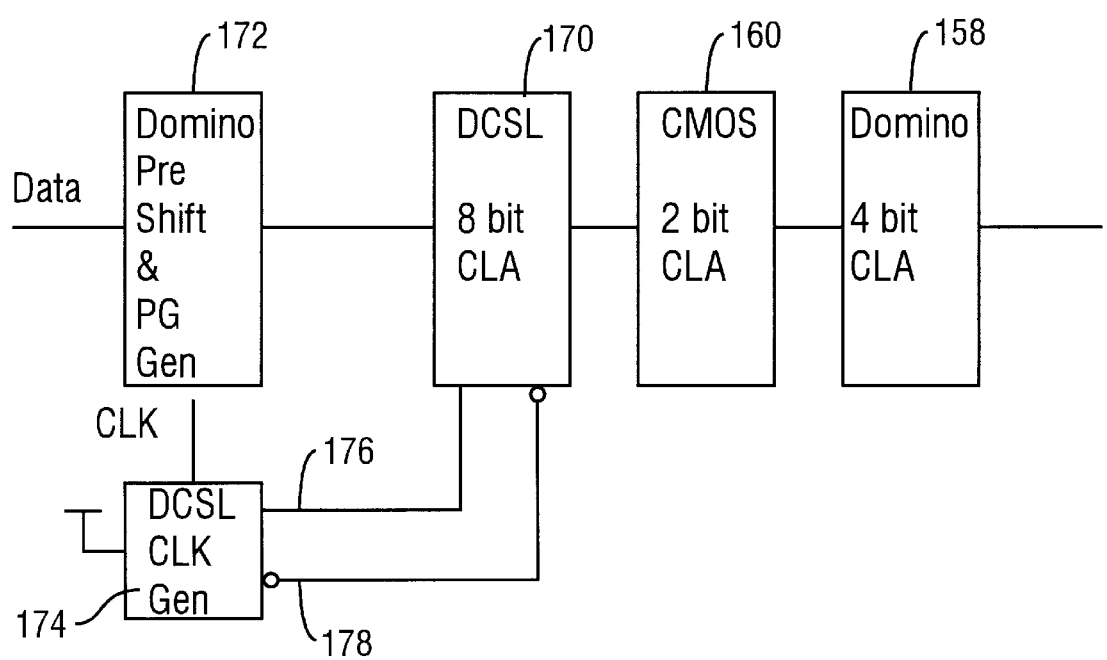
FIG. 8 illustrates an exemplary implementation of a 64 bit adder using a DCSL gate in accordance with the invention.

FIG. 8 illustrates the 64 bit adder circuit 150 of FIG. 7 implemented using a DCSL gate in accordance with the invention. In the exemplary DCSL-based adder 168, a single eight-input DCSL gate 170 replaces one of the 4-bit Domino CLAs 158 and one of the 2-bit CMOS CLAs 160 of the circuit of FIG. 7. Further, since the DCSL gate can directly accept Domino inputs, the Domino pre-shifter 152 and the CMOS PG 154 of FIG. 7 are combined into a single four-input Domino gate 172. A clock generator 174 times the path through the combined pre-shifter/PG 172 and generates the evaluate 176 and precharge 178 clock pulses required by the DCSL gate 170. Thus, the six logic levels of the prior art circuit 150 illustrated in FIG. 7 are reduced to four logic levels in the exemplary DCSL-based circuit 168 of FIG. 8, which results in a significant performance improvement. In one embodiment, the prior art adder 150 of FIG. 7 had a total delay time of 923 ps, while the exemplary DCSL-based adder 168 of FIG. 8 had a delay time of 703 ps, a 23% improvement.

The above description of an exemplary embodiment of the invention is made by way of example and not for purposes of limitation. Many variations may be made to the embodiments and methods disclosed herein without departing from the scope and spirit of the present invention. For example, alternate embodiments incorporating different PMOS/NMOS device combinations are envisioned. Further, one skilled in the art having the benefit of this disclosure would realize that other variations, such as a "precharge low" version of a DCSL circuit in accordance with the present invention are possible. The present invention is intended to be limited only by the scope and spirit of the following claims.

What is claimed is:

1. A differential current switch logic circuit comprising:
an evaluation tree including a plurality of input terminals and first and second output nodes;
an output network having first and second state outputs, the output network establishing both state outputs at a predetermined level during a precharge phase and providing a path to ground for one of the state outputs in response to the evaluation tree output nodes to establish the state outputs at complementary levels during an evaluate phase;

first and second evaluation transistors clocked by an evaluation clock signal, in which each state output is cross-coupled to drive the other output during the evaluate phase initiated by the evaluation clock signal;
a first isolation transistor coupled between the output network and one of the evaluation tree output nodes, the first isolation transistor having its gate coupled to the second state output;
a second isolation transistor coupled between the output network and the other complementary evaluation tree output node, the second isolation transistor having its gate coupled to the first state output; and
during the evaluate phase, one of the first or second isolation transistors isolates a non-grounded complementary output node of the evaluation tree from the output network.

2. The differential current switch logic circuit of claim 1 further comprising a state output amplifier for amplifying the complementary state outputs during the evaluate phase.

3. The differential current switch logic circuit of claim 1 further comprising a first clock signal for initiating the precharge phase.

4. The differential current switch logic circuit of claim 3 further comprising a second clock signal for initiating the evaluate phase.

5. The differential current switch logic circuit of claim 1 further comprising
first and second sense transistor pairs, each pair being coupled in series between a voltage supply and ground potential and having their gates coupled together, wherein the first and second state outputs are defined at respective junctions of the first and second sense transistor pairs.

6. A differential current switch logic circuit comprising:
an evaluation tree including a plurality of input terminals and first and second output nodes for output of complementary states;
first and second sense transistor pairs, each pair being coupled in series between a voltage supply and ground potential and having their gates coupled together, wherein first and second state outputs are defined at respective junctions of the first and second sense transistor pairs
first and second evaluation transistors clocked by an evaluation clock signal during an evaluate phase, in which the first state output is coupled to the gates of the second sense transistor pair through the first evaluation transistor and the second state output is coupled to the gates of the first sense transistor pair through the second evaluation transistor.

7. The differential current switch logic circuit of claim 6 further comprising a precharge clock signal for initiating a precharge phase to precharge the output to a precharge state.

8. The differential current switch logic circuit of claim 7 in which the evaluation clock signal for initiating an evaluate phase is complementary to the precharge clock signal.

9. The differential current switch logic circuit of claim 8 further comprising a first isolation transistor coupled between the first evaluation transistor and one of the evaluation tree output nodes, the first isolation transistor having its gate coupled to the second state output;
a second isolation transistor coupled between the second evaluation transistor and the other complementary evaluation tree output node, the second isolation transistor having its gate coupled to the first state output; and during the evaluate phase, one of the first or second isolation transistors isolates a non-grounded complementary output node of the evaluation tree from the respective sense transistor pair.

10. A differential current switch logic circuit comprising:

an evaluation tree including a plurality of input terminals and a pair of complementary output nodes;

means for generating first and second state outputs;

means for establishing the first and second state outputs at a predetermined level during a precharge phase;

means for clocking a cross-coupling of the state outputs and coupling to nodes of the evaluation tree during the evaluate phase;

means for evaluating signals on the input terminals during the evaluate phase to generate complementary state outputs.

11. A differential current switch logic circuit comprising:

an evaluation tree including a plurality of input terminals and a pair of complementary output nodes;

a pair of precharge transistors each coupled in series between a voltage supply and ground potential and being clocked by a precharge clock signal;

first and second sense transistor pairs, each pair being coupled in series between the voltage supply and ground potential and having their gates coupled together, wherein first and second state outputs are defined at respective junctions of the first and second sense transistor pairs;

first and second evaluation transistors clocked by an evaluation clock signal which is complementary to the precharge clock signal;

the first state output being coupled to the gates of the second sense transistor pair through the first evaluation transistor and the second state output being coupled to the gates of the first sense transistor pair through the second evaluation transistor;

a first isolation transistor coupled between the first evaluation transistor and one of the evaluation tree output nodes, the first isolation transistor having its gate coupled to the second state output; and a second isolation transistor coupled between the second evaluation transistor and the complementary evaluation tree output node, the second isolation transistor having its gate coupled to the first state output.

12. The differential current switch logic circuit of claim 11 further comprising a first supply coupling transistor coupled between the voltage supply and the first and second isolation transistors, the first supply coupling transistor being clocked by the precharge clock signal.

13. The differential current switch logic circuit of claim 12 further comprising second and third supply coupling transistors, each coupled respectively in series between the first supply coupling transistor and the first and second isolation transistors, the second supply coupling transistor having its gate coupled to the second state output and the third supply coupling transistor having its gate coupled to the first state output.

14. The differential current switch logic circuit of claim 11 wherein the first and second sense transistor pairs each comprise a PMOS transistor and an NMOS transistor, the PMOS transistor being coupled to the voltage supply and the NMOS transistor being coupled to ground potential.

15. The differential current switch logic circuit of claim 11 wherein the first and second evaluation transistors each comprise NMOS transistors.

16. The differential current switch logic circuit of claim 11 wherein the first and second isolation transistors each comprise NMOS transistors.

17. A method of providing complementary state outputs responsive to an evaluation tree which provides one path to ground in response to a plurality of inputs thereto, the state outputs being selectively isolated from the evaluation tree by a pair of switchable isolation devices coupled therebetween, the method comprising:

providing an output network including a pair of state outputs;

precharging both state outputs to a predetermined precharge level during a precharge phase;

maintaining the precharge level by feeding back the precharge level state outputs to the isolation devices;

establishing complementary evaluation levels at the state outputs by providing a path to ground through the evaluation tree by clocking an initiation of an evaluate phase for determining the path to ground for one of the state outputs, the output state being isolated from driving the output network until clocked in the evaluate phase;

isolating the other non-grounded complementary path by decoupling the non-grounded path by the use of one of the isolation devices.

* * * * *

UNITED STATES PATENT AND TRADEMARK OFFICE
CERTIFICATE OF CORRECTION

PATENT NO. : 6,014,041
DATED : January 11, 2000
INVENTOR(S) : Somasekhar et al.

It is certified that error appears in the above-indentified patent and that said Letters Patent is hereby corrected as shown below:

In column 4, at line 31, delete "flirter" and insert --further--.

Signed and Sealed this

Twentieth Day of March, 2001

*Attest:*

NICHOLAS P. GODICI

*Attesting Officer*      *Acting Director of the United States Patent and Trademark Office*